United States Patent [19]

Blomstedt et al.

[11] Patent Number: 4,862,326
[45] Date of Patent: Aug. 29, 1989

[54] POWER SUPPLY CONTACT

[76] Inventors: John W. Blomstedt, 22 Jeffrey Cir., Bedford, Mass. 01730; Wesley F. Irving, 169 Arnold St., Braintree, Mass. 02184; Mark S. Pusateri, 187 Lancaster, West Boylston, Mass. 01583

[21] Appl. No.: 183,356

[22] Filed: Apr. 12, 1988

Related U.S. Application Data

[63] Continuation of Ser. No. 20,154, Feb. 26, 1987, abandoned, which is a continuation of Ser. No. 750,431, Jul. 1, 1985, Pat. No. 4,685,032.

[51] Int. Cl.$^4$ .............................................. H05K 1/14
[52] U.S. Cl. ..................................... 361/413; 439/62; 439/81; 439/857; 439/861
[58] Field of Search ................... 361/407, 413; 439/62, 439/80, 81, 845, 850, 856, 861, 862, 857

[56] References Cited

U.S. PATENT DOCUMENTS

| | | | |
|---|---|---|---|
| 2,578,346 | 12/1951 | Lundy | 439/861 |
| 3,159,447 | 12/1964 | Crimmins et al. | 339/176 MF |
| 3,182,276 | 5/1965 | Ruehlemann | 339/17 |
| 3,412,369 | 11/1968 | Fox | 439/857 X |
| 3,470,421 | 9/1969 | Shore et al. | 361/413 X |
| 3,533,045 | 10/1970 | Henschen | 439/62 |
| 3,689,684 | 9/1972 | Cox et al. | 339/17 M X |
| 4,026,622 | 5/1977 | Siciliano | 439/857 X |
| 4,028,794 | 6/1977 | Ritchie, II et al. | 156/269 |
| 4,029,374 | 6/1977 | Nestor et al. | 339/17 F X |
| 4,080,027 | 4/1978 | Benasutti | 339/75 MP X |
| 4,220,382 | 9/1980 | Richie et al. | 439/61 |
| 4,242,721 | 12/1980 | Krolak | 361/415 |
| 4,531,793 | 7/1985 | Hochgesang | 339/17 F X |

FOREIGN PATENT DOCUMENTS

| | | | |
|---|---|---|---|
| 259661 | 1/1968 | Austria | 439/258 |
| 1061409 | 7/1959 | Fed. Rep. of Germany | 439/850 |

OTHER PUBLICATIONS

Winings, C. L., "A Printed-Circuit-Board Connector Family with up to Forty-Eight Contacts . . . ", Proceedings of 30th Electronic Components, IEEE, Apr. 1980, pp. 332-340.

Primary Examiner—R. R. Kucia
Assistant Examiner—Arthur Grimley

[57] ABSTRACT

An electronic system which requires high current provides a connector assembly which enables power supplies to be plugged into the same etched backplane as the logic printed circuit boards. The connector assembly handles high current, typically 150 amps at 5V DC. A female connector includes sets of fingers which flex at the base of the fingers to provide a low resistance contact.

3 Claims, 3 Drawing Sheets

ELECTRONIC SYSTEM 1

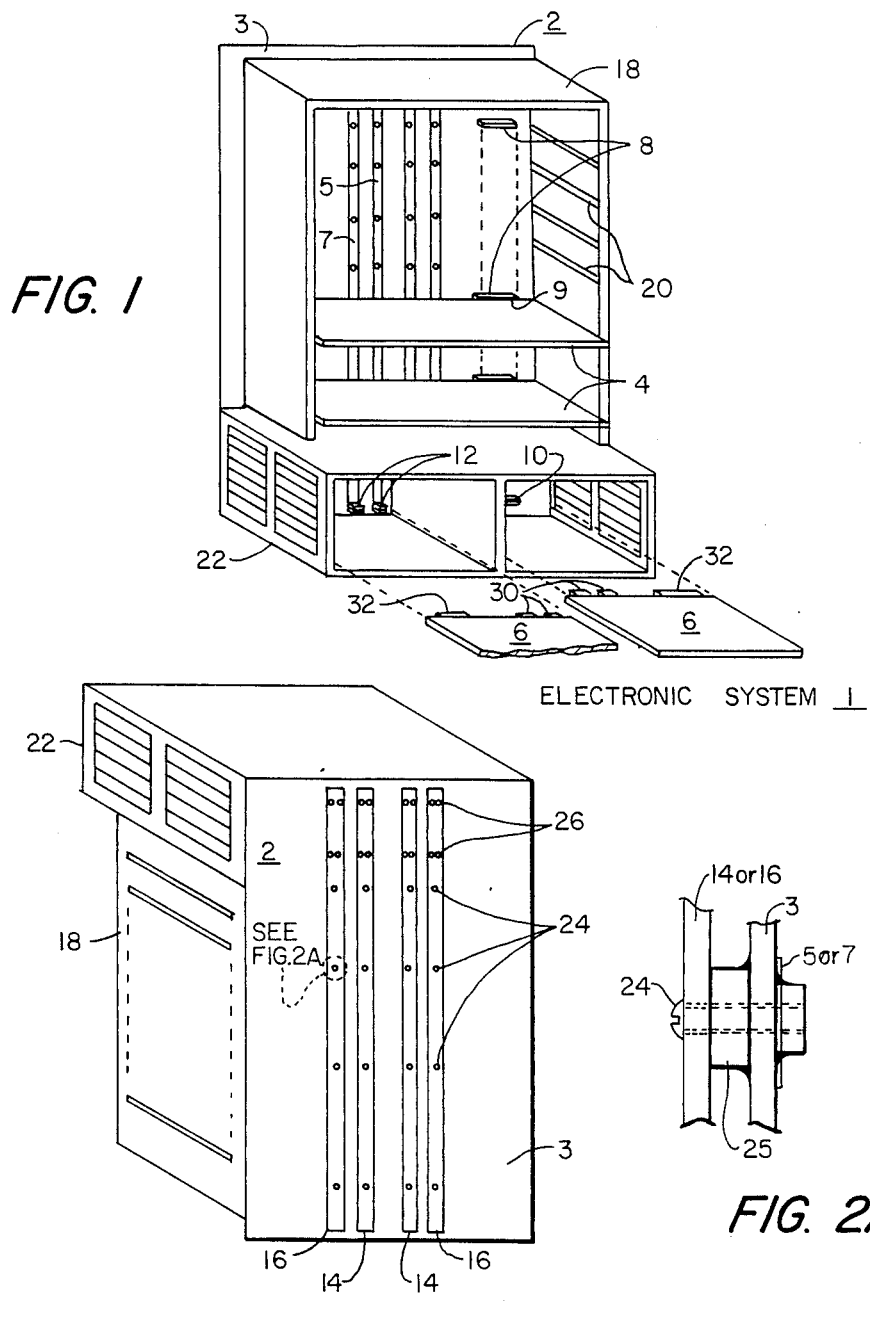

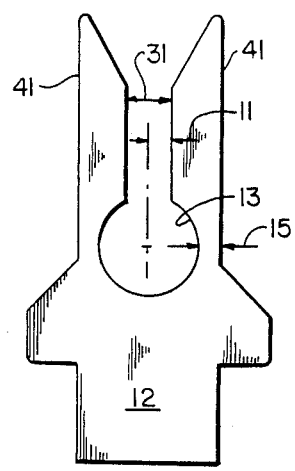 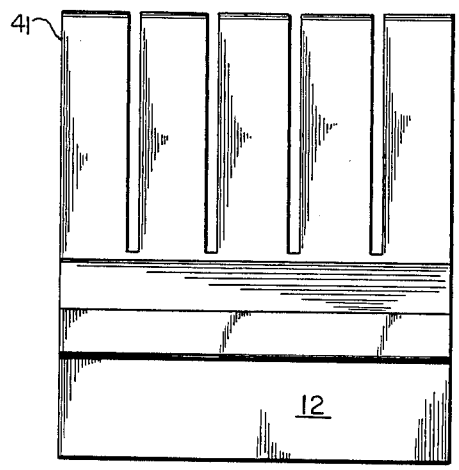
FIG. 5  FIG. 6
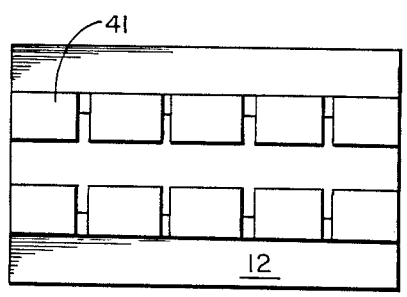 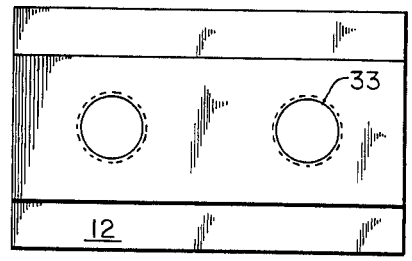
FIG. 3  FIG. 4

POWER SUPPLY CONTACT

This application is a continuation of application Ser. No. 20,154, filed Feb. 26, 1987, now abandoned, which is a continuation of application Ser. No. 750,431, filed July 1, 1985, now U.S. Pat. No. 4,685,032.

RELATED APPLICATION

The following U.S. patent application filed on an even date with the instant application and assigned to the same assignee as the instant application is related to the instant application and is incorporated herein by reference.

"Integrated Backplane" by John W. Blomstedt, Paul S. Yoshida, Wesley F. Irving and Vladimir Roudenko, having U.S. Ser. No. 750,441 and filed on July 1, 1985.

BACKGROUND OF THE INVENTION

1. Field of the Invention

This invention relates generally to the field of packaging electronic assemblies, and more specifically to the design of a connector for providing the ability to plug power supplies into the same logic backplane into which are plugged logic printed circuit board assemblies.

2. Description of the Prior Art

Electronic systems generally, and data processing systems in particular, require large amounts of logic voltage, typically 5V DC to power the system. These systems had a number of logic printed circuit boards which plugged into connectors mounted on an etched backplane. Voltage and ground were distributed by their respective etches.

The power supplies were bulky and were usually mounted in a separate area since they generated considerable heat. This heat was directed away from the printed circuit boards to avoid circuit malfunctions.

Heavy single conductor cable, typically 2 or 4 AWG or copper bars, are bolted to the backplane and the power supply to provide power. This cabling requirement presents a number of problems including requiring special conduits in the cabinet, providing additional cost, and having an increased voltage drop across both end connections. At times the bolted connections may loosen thereby generating subtle logic problems which are intermittent and therefore difficult to find. These prior cabled mechanical arrangements also make it difficult to service power problems.

OBJECTS OF THE INVENTION

Accordingly, it is a primary object of the invention to provide an improved power system.

It is an object of the invention to provide an improved power system which is less costly to design into the system.

It is another object of the invention to provide an improved power system by eliminating the requirement for power cables.

It is yet another object of the invention to provide a power system having means for readily plugging the power supply into the logic backplane.

SUMMARY OF THE INVENTION

An electronic system is packaged by using an integrated multilayer etched backplane into which are plugged logic printed circuit boards and power supplies. A connector assembly made up of a female connector and a blade provide the voltage and ground paths between the power supplies and the logic printed circuit boards. The connector assembly is designed typically to carry up to 150 amps at 5V DC.

The female connector includes a number of pairs of fingers, typically five. A means is provided at the base of the fingers to provide a smaller cross-sectional area to allow the fingers to flex when the blade is inserted between the fingers.

BRIEF DESCRIPTION OF THE DRAWINGS

The novel features which are characteristic of the invention are set forth with particularity in the appended claims. The invention itself, however, both as to organization and operation may best be understood by reference to the following description in conjunction with the drawings in which:

FIG. 1 is a breakout assembly view of the packaging of a typical electronic system;

FIG. 2 is a view of the back of the system;

FIG. 2A shows the detail of connecting the backplane to the bus bars;

FIGS. 3 through 6 show the various views of the female connector; and

DESCRIPTION OF THE PREFERRED EMBODIMENT

Figure 7:
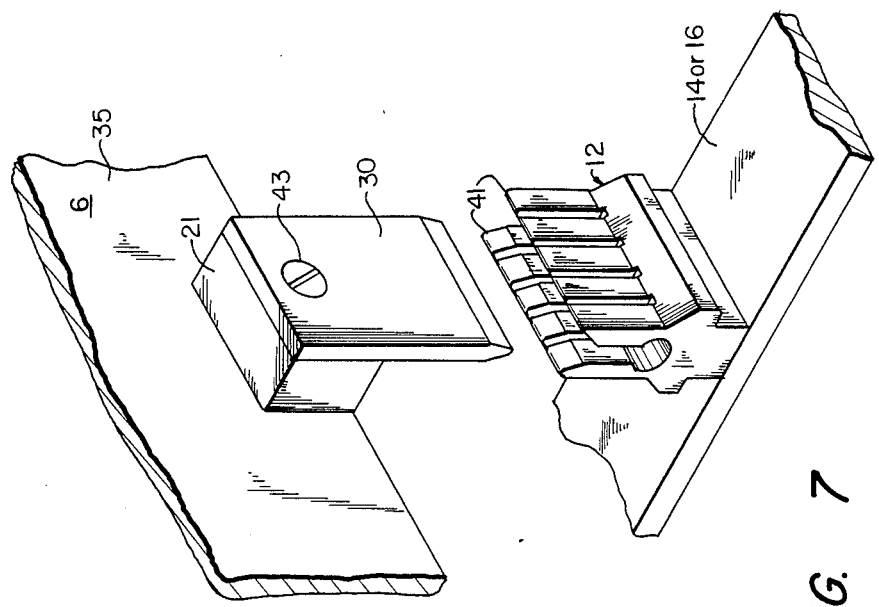
FIG. 7 is a view of the elements of the power supply voltage and ground connectors.

FIG. 1 shows the use of a female connector 12 of electronic system 1. A number of power supplies 6 supply power to a number of printed circuit boards 4. Ground is provided by power supplies 6, blade 30, one of the connectors 12, a bus bar 14, a bushing 25 of FIG. 2A, an etch 5, an etched backplane 3 of integrated backplane assembly 2, a connector 8, an edge connector 9, and printed circuit boards 4.

Similarly, voltage is applied to printed circuit boards 4 via power supplies 6, connector 12, bus bar 16, bushing 25, etch 7, etched backplane 3, connector 8, edge connector 9, and printed circuit boards 4.

Power control signals are transferred between the power supplies 6 via edge connectors 32, connectors 10, and etched backplane 3. Power control signals are transferred between the power supplies 6 via edge connectors 32, connectors 10, etched backplane 3, connectors 8, edge connectors 9, and printed circuit boards 4.

Included in electronic system 1 are a guide 18 fastened to etched backplane 3 and containing channels 20 for supporting printed circuit boards 4. Also, a cage 22 provides physical support for power supplies 6.

Connectors 12 are bolted to bus bars 14 and 16 by means of bolts 26.

Bus bars 14 and 16 are also fastened to printed circuit boards 4 via bolt 24 into a tapped hole in bushing 25, FIG. 2A. Bushing 25 is soldered to the power etches 5 and 7.

FIG. 2 is a back view of the electronic system 1 packaging showing the bus bars 14 and 16 coupled to backplane 3 of integrated backplane assembly 2. Bolts 26 fasten connectors 12 of FIG. 1 to bus bars 14 and 16. Also shown is the guide 18 and the cage 22.

FIG. 2A shows how the bus bars 14 and 16 are electrically coupled to the etch 5 or 7 by soldering and physically coupled to backplane 3 by the bushing 25 having a threaded hole for receiving screw 24. Note that bus bars 14 and 16 are fastened to the etches 5 and 7 in a number of locations thereby reducing the possibility of circuit ground loops.

FIGS. 3, 4, 5 and 6 show the top, bottom, side and front views, respectively, of connector 12. FIG. 6 shows the sets of fingers 41. Five sets of fingers 41 are shown but this invention is not limited to the five sets of fingers 41.

Referring to FIG. 5, connector 12 includes a hole 13 to establish a thin section 15 to act as a fulcrum about which each finger of the sets of fingers 41 will flex when blade 30 of FIG. 7 is inserted.

The distance between one row of fingers of each set of fingers 41 is related to the centerline of the hole by a dimension 11 and the distance between corresponding fingers of the set of fingers 41 is dimension 31 wherein dimension 31 is twice dimension 11.

FIG. 4 shows the tapped hole 33 at a predetermined depth sufficient to hold connector 12 securely to bus bar 14 or 16 by bolts 26, FIG. 2.

FIG. 7 shows power supply 6 having blade 30 mounted to an etched board 33 by means of a block 10 and a screw 13.

The material of connector 12 is typically a copper beryllium alloy plated with 0.0005 inches of silver.

The blade 30 material is typically silver-plated copper having a thickness of typical 0.093 inches.

The current carrying capability of connector 12 of 150 amps DC is determined by the minimum cross-sectional area 15, FIG. 5, of the set of fingers 41. Typically one finger of the set of fingers 41 would have a cross-sectional area 0.00816 square inches or 8160 square mils. Since 1 square mil equals 1.274 circular mils, the cross-sectional area is approximately 10,400 (8160×1.274) circular mils or 104,000 circular mils for 10 fingers. The current carrying capacity is 500 circular mils per ampere or 208 amps. This value is deroted to 150 amps for reliability reasons.

The contact area for carrying the 150 ampere current between the connector 12 and the blade 30 is typically 0.0527 square inches. This contact area occurs after insertion at the dimension 15 located at the tip of each finger. This is calculated by multiplying the width of each finger, typically 0.170 inches by 1/32 inches which approximates the distance perpendicular to the finger width and multiplying by 10, the number of fingers.

This contact area gives a resistance of 0.00000274 ohms or a voltage drop at 5V DC of approximately 400 microvolts.

Having shown and described a preferred embodiment of the invention, those skilled in the art will realize that many variations and modifications may be made to affect the described invention and still be within the scope of the claimed invention. Thus, many of the elements indicated above may be altered or replaced by different elements which will provide the same result and fall within the spirit of the claimed invention. It is the intention, therefore, to limit the invention only as indicated by the scope of the claims.

What is claimed is:

1. An electronic system includes a plurality of logic circuit boards and a plurality of power supplies providing for the high current needs of of up to a maximum of 208 amperes said electronic system, said plurality of logic circuit boards being plugged into logic connectors mounted on an integrated etched backplane assembly for transferring logic signals and receiving voltage and ground signals, and each of said plurality of power supplies being plugged into a first power connector for completing a ground path and into a second power connector for completing a voltage path, each of said first and said second power connectors being mounted on said backplane assembly, each power connector comprising:

fastening means for coupling to said backplane assembly;

contact means for coupling to one of said plurality of power supplies, said contact means including a plurality of sets of fingers, each set being in contact with blade means, said blade means being coupled to said one of said plurality of power supplies for completing said voltage or said ground path, a top portion of each finger of each set of said plurality of sets of fingers being in contact with said blade means on opposite sides of said blade means and exerting forces in opposite directions against said blade means; and flexing means coupled to said contact means and said fastening means for providing a fulcrum at a bottom portion of said each finger about which said each finger will rotate to exert said force when said blade means is inserted between said each set.

2. The contact means of claim 1 which applies high current of up to a maximum of 208 amperes received from a power supply to a bus bar, said contact means comprising:

a power supply blade;

a base portion including means for mounting said power connector to said bus bar;

a top portion including a plurality of sets of fingers, each set of fingers being spaced a predetermined distance apart which receives said power supply blade having a predetermined thickness wherein said predetermined thickness is greater than said predetermined distance apart; and a middle portion coupled to said base and said top portion including means for terminating each finger at a first end such as to provide a fulcrum about which said each finger rotates as said power supply blade is inserted between said each set of fingers, wherein said each set of fingers makes contact at a second end wherein said first and said second end are at opposite ends of said fingers.

3. An electronic system comprising:

a backplane assembly having means for conducting current;

a plurality of logic boards, each coupled to said backplane assembly and receiving said current; plurality of power supplies supplying said current of up to 208 amperes;

a plurality of connector means, each coupled to a respective1 one of said plurality of power supplies and said conducting means to apply said current to said plurality of logic boards, each of said plurality of connector means including;

first blade and a second blade coupled to each of said plurality of power supplies;

a first connector and a second connector coupled to said conducting means, said first blade pluggably connected to said first connector to apply said current to said conducting means and said second connector pluggably connected to said second blade to provide a ground path from said conducting means to said each of said power supplies;

each of said first and said second connectors including, fastening means for coupling to said backplane assembly;

contact means for coupling to one of said plurality of power supplies, said contact means including a plurality of sets of fingers, each set being in contact with said first or said second blade, said first or said second blade being coupled to said one of said plurality of power supplies for completing said current or said ground path, respectively, a top portion of each finger of each set of said plurality of sets of fingers being in contact with said first or said second blade on opposite sides of said first or said second blade and exerting forces in opposite directions against said first or said second blade; and flexing means coupled to said contact means and said fastening means for providing a fulcrum at a bottom portion of said each finger about which said each finger will rotate to exert said force when said first or said second blade is inserted between said each set.

* * * * *

UNITED STATES PATENT AND TRADEMARK OFFICE
CERTIFICATE OF CORRECTION

PATENT NO. : 4,862,326

DATED : August 29, 1989

INVENTOR(S) : John W. Blomstedt, Wesley F. Irving and Mark S. Pusateri

It is certified that error appears in the above-identified patent and that said Letters Patent is hereby corrected as shown below:

Title page:

Assignee: Bull HN Information Systems Inc., Billerica, Mass.

Attorney, Agent or Firm - George Grayson; John S. Solakian; Lewis P. Elbinger

Signed and Sealed this

Third Day of April, 1990

Attest:

HARRY F. MANBECK, JR.

Attesting Officer

Commissioner of Patents and Trademarks